United States Patent
Preuschl

(10) Patent No.: US 9,203,008 B2
(45) Date of Patent: Dec. 1, 2015

(54) MULTILAYERED LED PRINTED CIRCUIT BOARD

(71) Applicant: OSRAM GmbH, Munich (DE)

(72) Inventor: Thomas Preuschl, Sinzing (DE)

(73) Assignee: OSRAM GmbH, Munich (DE)

(*) Notice: Subject to any disclaimer, the term of this patent is extended or adjusted under 35 U.S.C. 154(b) by 0 days.

(21) Appl. No.: 14/017,351

(22) Filed: Sep. 4, 2013

(65) Prior Publication Data

US 2014/0061692 A1 Mar. 6, 2014

(30) Foreign Application Priority Data

Sep. 6, 2012 (DE) .......................... 10 2012 215 788

(51) Int. Cl.
*H01L 33/64* (2010.01)
*H05K 1/02* (2006.01)
*H05K 1/18* (2006.01)

(52) U.S. Cl.
CPC ............ *H01L 33/641* (2013.01); *H05K 1/0206* (2013.01); *H05K 1/0204* (2013.01); *H05K 1/185* (2013.01); *H05K 2201/0187* (2013.01); *H05K 2201/10106* (2013.01)

(58) Field of Classification Search
CPC ......... H01L 33/00; H01L 33/641; H05K 3/00
USPC ............ 257/91, 89, 59, 98, E51.026; 438/98
See application file for complete search history.

(56) References Cited

U.S. PATENT DOCUMENTS

| 2006/0180821 | A1* | 8/2006 | Fan et al. .......................... 257/98 |
| 2007/0091620 | A1* | 4/2007 | Matheson ....................... 362/367 |
| 2008/0244902 | A1* | 10/2008 | Blackwell et al. .............. 29/844 |
| 2010/0001294 | A1* | 1/2010 | Faller et al. ...................... 257/79 |
| 2010/0038665 | A1* | 2/2010 | Sugiura et al. .................. 257/98 |
| 2010/0200277 | A1* | 8/2010 | Huang et al. .................. 174/252 |
| 2011/0291154 | A1* | 12/2011 | Noichi et al. .................... 257/99 |
| 2012/0085574 | A1* | 4/2012 | Park et al. ...................... 174/264 |

FOREIGN PATENT DOCUMENTS

| EP | 1916884 A1 | 4/2008 |
| EP | 2104408 A1 | 9/2009 |
| WO | WO2013124241 A1 * | 8/2013 ............... H05K 1/02 |

* cited by examiner

*Primary Examiner* — Karen Kusumakar
*Assistant Examiner* — Adam S Bowen

(57) ABSTRACT

A multilayered LED printed circuit board with electrically insulating layers includes at least one electrically insulating material and electrically conductive layers consisting of an electrically conductive material, wherein at least one of the electrically conductive layers is structured with a conductor track structure, wherein the at least one structured electrically conductive layer is arranged on an upper side of the LED printed circuit board, and wherein a plurality of LEDs is arranged on the at least one structured electrically conductive layer on the upper side. The LED printed circuit board further includes: a thermally conducting element, and thermal paths comprising an electrically conductive material, which are arranged, in each case in contact-making fashion, between the LEDs and the thermally conducting element.

9 Claims, 1 Drawing Sheet

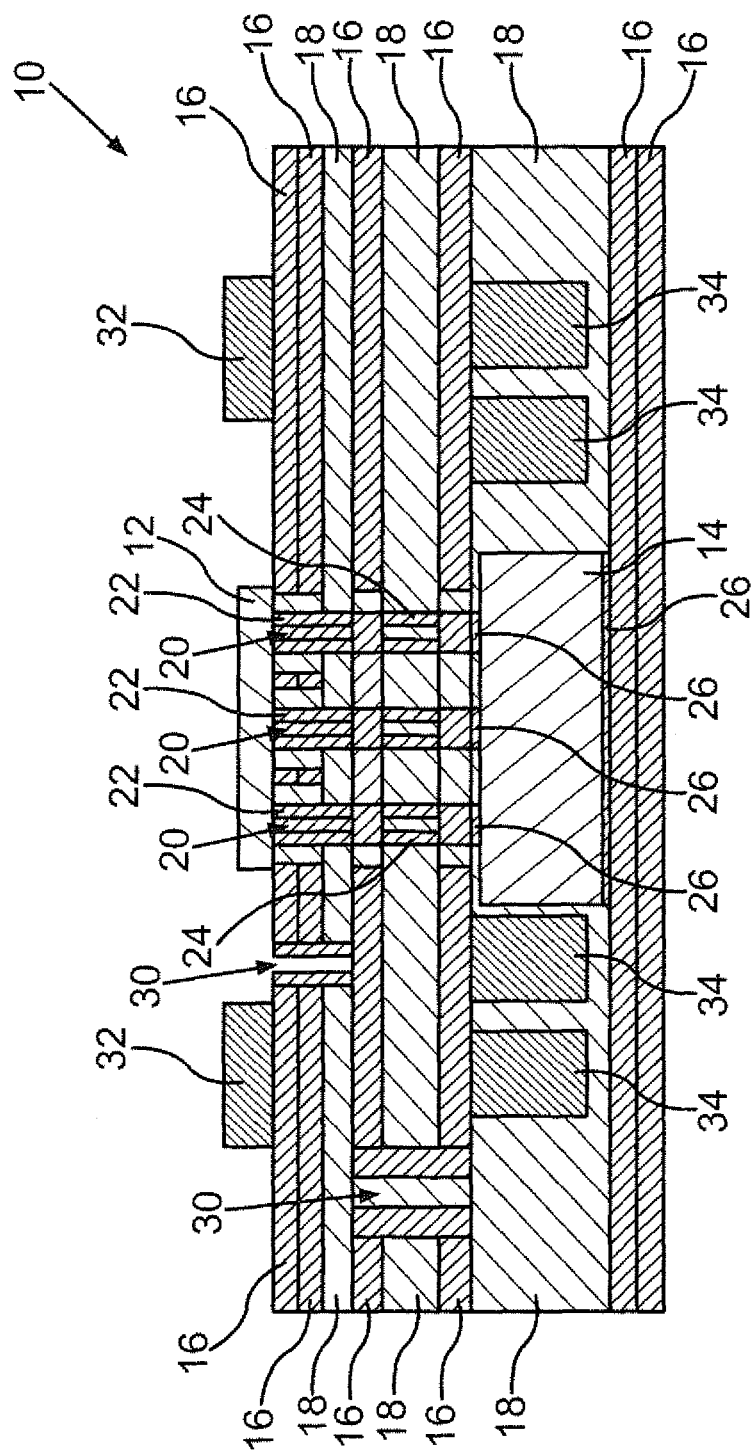

MULTILAYERED LED PRINTED CIRCUIT BOARD

RELATED APPLICATIONS

The present application claims priority from German application No. 10 2012 215 788.3 filed on Sep. 6, 2012.

TECHNICAL FIELD

Various embodiments relate to a multilayered LED printed circuit board.

BACKGROUND

In order to provide printed circuit boards which have a degree of integration which is as high as possible, multilayered printed circuit boards are known from the prior art which have a plurality of electrically conductive layers, which comprise conductor track structures and which are isolated from one another by electrically insulating layers. The use of such multilayered printed circuit boards for LED modules is problematic, however, since the thermal paths are also significantly enlarged by a greater number of layers, said thermal paths being used to dissipate the lost heat from the LEDs. Precisely in the case of very tightly positioned LEDs on such a multilayered printed circuit board, sufficient heat dissipation is not possible.

SUMMARY

Various embodiments provide a multilayered LED printed circuit board which enables improved heat dissipation.

The multilayered LED printed circuit board according to the disclosure includes electrically insulating layers comprising an electrically insulating material and electrically conductive layers consisting of an electrically conductive material, wherein at least one of the electrically conductive layers is structured with a conductor track structure. Furthermore, the at least one structured electrically conductive layer is arranged on an upper side of the printed circuit board, wherein a plurality of LEDs is arranged on the at least one structured electrically conductive layer on the upper side. Furthermore, the LED printed circuit board includes a thermally conducting element, and thermal paths comprising an electrically conductive material, which are arranged, in each case in contact-making fashion, between the LEDs and the thermally conducting element. The thermal paths are electrically insulated from one another and are designed to conduct heat away from the LEDs. Furthermore, the thermally conducting element comprises a material which is designed to thermally couple and electrically isolate the thermal paths of the respective LEDs.

The structurings of the electrically conductive layers in this case define conductor track structures of the electrically conductive layers. In this case, a plurality of electrically conductive layers, in particular also inner layers of the multilayered LED printed circuit board, can also bear conductor track structures.

By virtue of the thermally conducting element which is designed to thermally couple and electrically isolate the thermal paths of the LEDs, joint heat spreading of the lost heat from the LEDs can be effected. At the same time it is ensured that the electrical potentials of the LEDs are isolated, which first enables joint heat spreading. By virtue of this coupling of the thermal paths, substantially improved heat dissipation can be achieved. Only thereby is it possible for a very large number of LEDs or LED clusters to be capable of being positioned very tightly on the upper side of the printed circuit board since sufficient heat dissipation is now made possible by the joint heat spreading.

In this case, the thermally conducting element preferably consists of a second electrically insulating material which has a higher thermal conductivity than the electrically insulating material of the electrically insulating layers of the LED printed circuit board. Owing to the electrically insulating property of the thermally conducting element material, it is ensured that the respective electrical potentials of the LEDs are isolated from one another, while the high thermal conductivity, which is substantially greater than that of the insulating layers of the LED printed circuit board, enables thermal coupling of the thermal paths.

In an advantageous configuration of the disclosure, the second electrically insulating material of the thermally conducting element is an inorganic material. Preferably, in this case a ceramic material, such as an aluminum oxide ceramic or an aluminum nitride ceramic, for example, is used since these materials have very high thermal conductivity, and in particular a thermal conductivity which is much higher than the organic materials used preferentially for the electrically insulating layers of the printed circuit board, such as FR4.

In an advantageous configuration of the disclosure, the thermally conducting element is arranged in such a way that a region in which the thermal paths make contact with the thermally conducting element is arranged at least partially in an electrically insulating layer of the LED printed circuit board. This ensures the isolation of the potentials since if this region were to be arranged in or on an electrically conductive layer, this layer would produce an electrically conductive connection between the thermal paths.

Further preferred is an arrangement of the thermally conductive element at least partially, and in particular completely, in an electrically insulating layer of the LED printed circuit board, whereby completely should be understood to mean that the thermally conducting element is surrounded on all sides by an insulating layer apart from the points at which the thermal paths of the LEDs make contact with the thermally conducting element and further points at which thermal paths can likewise be arranged in contact-making fashion for heat dissipation away from the thermally conducting element. Thus, the thermally conducting element can be integrated in a particularly advantageous manner with a compact arrangement in the multilayered LED printed circuit board in a particularly space-saving manner.

In a further advantageous configuration of the disclosure, the thermally conducting element is arranged at least partially in an electrically insulating layer of the LED printed circuit board, wherein electrical components are arranged in contact-making fashion on an electrically conductive layer in the same electrically insulating layer. Thus, the installation space which is predetermined by the thickness of an electrically insulating layer is used effectively or a certain thickness of the insulating layer is predetermined by the space requirement for the integrated components, i.e. components on the inner layers of the multilayered LED printed circuit boards, which thickness can at the same time be used for integrating or embedding the thermally conducting element in this layer in a compact and space-saving manner.

In a further advantageous configuration of the disclosure, the thermal paths are arranged perpendicular to the layers of the LED printed circuit board. This enables simple production of the LED printed circuit board. In particular, it is preferable to arrange the thermally conducting element beneath the LEDs in order to be able to dissipate the heat over the shortest path, i.e. perpendicularly downwards towards the lower side of the LED printed circuit board. In this case, it is furthermore sufficient to configure the thermally conducting element in such a way that it is arranged in a region which is not substantially larger than the region in which the LEDs are arranged on the upper side of the LED printed circuit board, which enables a particularly compact configuration of the multilayered LED printed circuit board and for example the integration of electrical components in the same layer.

Furthermore, the thermal paths can be formed particularly simply as vias (vertical interconnect access) comprising an electrically conductive material. Thus, these paths can be configured, for example, as vias filled with a metallic material or as microvias or laser vias with electroplating.

Preferably, the thermal paths can comprise copper. Copper likewise has a very high thermal conductivity and, owing to the coupling of these paths to the thermally conducting element which likewise has a very high thermal conductivity, optimum heat dissipation can thus be enabled.

Advantageously, the thermal paths can pass through at least one inner electrically conductive layer of the LED printed circuit board, wherein the thermal paths are electrically insulated from the at least one layer. In particular, the paths can also run through all inner electrically conductive layers, which enables heat dissipation to the outside, in particular to the lower side of the multilayered printed circuit board, in a particularly advantageous manner.

Furthermore, the thermally conducting element can be coupled to a lower side of the printed circuit board, which lower side is arranged opposite the upper side. Therefore, direct heat dissipation to the outside, i.e. to the lower side of the printed circuit board, is enabled.

In a very advantageous configuration of the disclosure, the lower side is formed from an electrically conductive layer which can be coupled to a heat sink. This electrically conductive layer can in this case preferably be formed from one or more copper layers. The coupling of the thermally conducting element to these copper outer layers can in this case in turn be implemented by microvias and copper electroplating, for example. Owing to the coupling of the thermally conducting element to the copper outer layers and the possibility of coupling these layers to a heat sink, such as a cooling body, for example, particularly effective heat dissipation can be provided.

Further advantages, features and details of the invention are given in the description below relating to preferred embodiments with reference to the drawing.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 1 shows a schematic illustration of a multilayered LED printed circuit board with an LED cluster arranged thereon and an integrated thermally conducting element in accordance with an exemplary embodiment of the disclosure.

DETAILED DESCRIPTION

The following detailed description refers to the accompanying drawing that show, by way of illustration, specific details and embodiments in which the disclosure may be practiced. FIG. 1 shows a schematic illustration of a multilayered LED printed circuit board 10 having an LED cluster 12 which is arranged thereon and which has a plurality of LEDs, and with an integrated thermally conducting element 14 in accordance with an exemplary embodiment of the invention. The LED printed circuit board 10 in this case has a layer sequence of electrically conductive layers 16 and electrically insulating layers 18. The electrically conductive layers 16 can in this case be structured by conductor track structures or be defined as conductor track structure and preferably consist of copper. The electrically insulating layers 18 in this case preferably comprise an organic material, in particular of a typical printed circuit board base material such as FR4, for example. A thermally conducting element 14 consisting of an electrically insulating material with a high thermal conductivity is arranged in one of these electrically insulating layers 18. By embedding the inorganic, electrically insulating thermally conducting element 14 with high thermal conductivity in the multilayered LED printed circuit board 10, joint heat spreading of the LEDs with simultaneous potential isolation is enabled in a particularly advantageous manner. Furthermore, by virtue of this joint heat spreading, substantially improved heat dissipation of the heat loss of the LEDs is enabled. In addition, this has the advantage that a large number of LEDs can thus be positioned very tightly. The combination of a multilayered printed circuit board with a thermally conducting element 14 for joint heat spreading of the LEDs thus enables an extremely high degree of integration of this LED printed circuit board 10.

In this case, the thermally conducting element 14 is preferably formed from a ceramic material, such as an aluminum oxide ceramic or aluminum nitride ceramic, for example. These ceramics have a very high thermal conductivity, in particular a thermal conductivity which is substantially higher than that of the organic base material FR4. Furthermore, the LEDs in the LED cluster 12 can be arranged on copper pads on the upper side of the LED printed circuit board 10. The copper pads of all LEDs on the first layer, i.e. on the upper side, are electrically isolated from one another and are therefore also thermally isolated from one another. By virtue of contact being made with these copper pads via thermal paths 20 with the thermally conducting element 14, thermal coupling and thus joint heat spreading of the lost heat from the LEDs is enabled. The thermally conducting element 14 is in this case structured, wherein this structuring relates to the contact points at which contact is made with the thermal paths 20. These thermal paths 20 can in this case be in the form of copper-filled vias 22, copper-galvanized vias 24 or copper-galvanized laser vias or microvias 26. Furthermore, these electrically conductive paths 20 are electrically insulated from one another in order to ensure that the potentials of the LEDs are isolated from one another. In particular, the use of microvias 26 which have a very small diameter in the micrometers range likewise enables a very compact arrangement of the LEDs.

Furthermore, the thermally conducting element 14 can be coupled to copper outer layers on the lower side of the LED printed circuit board 10. This coupling can likewise take place, for example, by means of microvias 26 and copper electroplating. Thus, the possibility is provided in a very advantageous manner of dissipating the lost heat from the LEDs directly onto the outer layers of the LED printed circuit board 10 These outer layers can be coupled to a cooling body for improved heat dissipation. Thus, the LED printed circuit board 10 makes it possible to thermally connect the rear side and at the same time to keep the rear side free of potential by virtue of the coupling via the electrically insulating thermally conducting element.

Furthermore, yet further components can be arranged on the inner layers or on the upper side of the printed circuit board, such as surface-mounted components 32 or embedded components 34, such as capacitors, for example. In order to electrically connect the individual electrically conductive layers 16, the LED printed circuit board 10 can have through-platings 30, for example. Thus, the LED printed circuit board 10 can cope with the high degree of wiring complexity which is required for the large number of LEDs by virtue of its multilayered design and at the same time joint heat spreading and thus markedly improved heat dissipation can be provided by the integrated thermally conducting element 14.

Overall, an inexpensive and highly integrated module is thus provided which, by virtue of integration of an electrically insulating core which nevertheless has good thermal conductivity in a multilayered LED printed circuit board and by virtue of the connection of the core to the LEDs and the copper outer layers by means of microvias or laser vias and copper electroplating, enables joint heat spreading of the heat loss from the LEDs with at the same time potential isolation. As a result, the heat dissipation can be markedly improved, with the result that a very tightly positioned arrangement of a large number of LEDs in a cluster, such as an Oslon chip, for example, on a multilayered printed circuit board is enabled.

While the disclosed embodiments has been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A multilayered LED printed circuit board with electrically insulating layers comprising:
    at least one electrically insulating material; and
    electrically conductive layers consisting of an electrically conductive material;
    wherein at least one of the electrically conductive layers is structured with a conductor track structure
    wherein the at least one structured electrically conductive layer is arranged on an upper side of the LED printed circuit board and
    wherein a plurality of LEDs is arranged on the at least one structured electrically conductive layer on the upper side, the LED printed circuit board further comprising:
    a thermally conducting element; and
    thermal paths comprising an electrically conductive material, which are arranged, in each case in contact-making fashion, between the LEDs and the thermally conducting element;
    wherein the thermal paths are electrically insulated from one another and are designed to conduct heat away from the LEDs; and
    wherein the thermally conducting element comprises a material which is designed to thermally couple and electrically isolate the thermal paths of the respective LEDs;
    wherein the thermally conducting element is arranged in such a way that a region in which the thermal paths make contact with the thermally conducting element is arranged at least partially in an electrically insulating layer of the LED printed circuit board.

2. The multilayered LED printed circuit board as claimed in claim 1, wherein the thermally conducting element consists of a second electrically insulating material which has a higher thermal conductivity than the electrically insulating material of the electrically insulating layers of the LED printed circuit board.

3. The multilayered LED printed circuit board as claimed in claim 2, wherein the second electrically insulating material is an inorganic material.

4. The multilayered LED printed circuit board as claimed in claim 1, wherein the thermally conducting element is arranged at least partially in an electrically insulating layer of the LED printed circuit board, wherein electrical components are arranged in contact-making fashion on an electrically conductive layer in the same electrically insulating layer.

5. The multilayered LED printed circuit board as claimed in claim 1, wherein the thermal paths are arranged perpendicular to the layers of the LED printed circuit board.

6. The multilayered LED printed circuit board as claimed in claim 1, wherein the thermal paths comprise copper.

7. The multilayered LED printed circuit board as claimed in claim 1, wherein the thermal paths pass through at least one inner electrically conductive layer of the LED printed circuit board, wherein the thermal paths are electrically insulated from the at least one electrically conductive layer.

8. The multilayered LED printed circuit board as claimed in claim 1, wherein the thermally conducting element is coupled to a lower side of the LED printed circuit board, which lower side is arranged opposite the upper side.

9. The multilayered LED printed circuit board as claimed in claim 1, wherein the lower side is formed from an electrically conductive layer which can be coupled to a heat sink.

* * * * *

UNITED STATES PATENT AND TRADEMARK OFFICE
CERTIFICATE OF CORRECTION

| | | |
|---|---|---|
| PATENT NO. | : 9,203,008 B2 | |
| APPLICATION NO. | : 14/017351 | |
| DATED | : December 1, 2015 | |
| INVENTOR(S) | : Thomas Preuschl | |

It is certified that error appears in the above-identified patent and that said Letters Patent is hereby corrected as shown below:

Specification

Column 1, line 7: Please write the words ", which is hereby incorporated by reference." after the date "Sep. 6, 2012".

Column 4, line 65: Please place a "." between "10" and the word "These".

Signed and Sealed this
Twenty-ninth Day of March, 2016

Michelle K. Lee
*Director of the United States Patent and Trademark Office*